United States Patent [19]
Kelley et al.

[11] Patent Number: 5,748,428
[45] Date of Patent: May 5, 1998

[54] PULSE WIDTH MODULATION AND PROTECTION CIRCUIT

[75] Inventors: Jeffrey T. Kelley, Plymouth; Bruce Wrenbeck, Dearborn, both of Mich.

[73] Assignee: United Technologies Automotive, Inc., Dearborn, Mich.

[21] Appl. No.: 508,715

[22] Filed: Jul. 28, 1995

[51] Int. Cl.$^6$ ........................................... H02H 3/00
[52] U.S. Cl. .................. 361/94; 361/59; 315/307
[58] Field of Search ........................ 361/18, 54, 57, 361/59, 71, 72, 87, 93, 94, 100, 154; 315/76, 77, 82, 119, 307; 307/10.1, 10.8

[56] References Cited

U.S. PATENT DOCUMENTS

| | | | |
|---|---|---|---|
| 4,477,748 | 10/1984 | Grubbs | 315/307 |
| 4,686,428 | 8/1987 | Kuhnel et al. | 315/307 |
| 4,739,226 | 4/1988 | Murata | 307/10.8 |
| 4,761,702 | 8/1988 | Pinard | 361/18 |
| 4,825,144 | 4/1989 | Alberkrack et al. | 363/71 |
| 4,994,934 | 2/1991 | Bouhenguel | 361/71 |
| 5,001,398 | 3/1991 | Dunn | 315/377 |

FOREIGN PATENT DOCUMENTS 0068405  1/1983  European Pat. Off. ........ H03K 17/08
0599455  6/1994  European Pat. Off. ........ H02H 3/08

OTHER PUBLICATIONS

Article: EDN Sense-cell MOSEFET eliminates losses in source circuit, Jun. 1986.

*Primary Examiner*—Ronald W. Leja
*Attorney, Agent, or Firm*—Howard & Howard

[57] ABSTRACT

A pulse width modulation circuit includes a transistor pass element alternately switched on and off by an oscillator and connecting a power source to a load. Current through the transistor pass element is compared to a reference signal by a comparator. If the current through the transistor pass element exceeds the reference signal, the comparator generates a fault signal, and the transistor pass element is switched off for the remainder of the cycle. After a predetermined number of faults, the transistor pass element is switched off for a plurality of cycles. The pulse width modulation circuit prevents damage to the transistor pass element caused by the low initial resistance of the load and supplies sufficient current to slowly heat the load to steady state operation. This also allows for downsizing of the pass element for steady state conditions thereby saving product cost.

20 Claims, 2 Drawing Sheets

PULSE WIDTH MODULATION AND PROTECTION CIRCUIT

BACKGROUND OF THE INVENTION

The present invention relates to a pulse width modulation circuit and more particularly to a pulse width modulation circuit with overcurrent protection.

Pulse width modulators are used to supply variable average power to resistive and capacitive loads. Pulse width modulators are frequently used in dimmer switches for lamps in automobiles, such as the instrument panel lamps. The pulse width modulation circuit generally includes a transistor pass element connected between the power supply and the load. The transistor pass element is switched on and off at a constant frequency but variable duty cycle to provide variable average power to the load. The average power supplied to the load is proportional to the duty cycle. The variable average power "dims" or brightens the lamp in the instrument panel application.

Many resistive loads, particularly lamps, have a positive temperature coefficient, i.e., the resistance increases as the temperature of the load increases. Further, the load generates heat proportionally to the current passing through it. A positive temperature coefficient load has a low initial resistance and therefore conducts more current at startup. This large currents cause the load to heat. As the load heats, its resistance increases, reducing current flow until a steady state is reached.

In a pulse width modulation circuit, the initial low resistance of the cold load causes large currents to pass through the transistor pass element before the load increases its resistance and reaches a steady state. This large initial current may overheat the transistor pass element. This is undesirable. In the past, the transistors have been designed to withstand the start-up current. However, the design choices necessary to withstand large startup current do not provide the best steady state operation. This is particularly a problem in vehicles, where cold lamp elements draw high currents during startup.

SUMMARY OF THE INVENTION

The present invention provides a pulse width modulation circuit for use as a dimmer switch, particularly in a vehicle instrument panel. The circuit is protected from high currents during startup and provides current to a cold load to slowly heat it to steady state operation. The circuit is protected by abbreviating the duty cycle in which an overcurrent condition, or fault, occurs. The duty cycles are abbreviated to protect the circuit until the resistance of the load is increased to a safe level. Further, the circuit is protected from recurring faults by switching off the circuit for a plurality of cycles after a predetermined number of faults have been detected. However, the load is supplied with sufficient current to steadily move toward steady state operation.

The pulse width modulator circuit generally includes an oscillator alternately switching a transistor pass element connecting a power supply to a load. A shunt senses the current passing through the transistor pass element during a cycle. A comparator compares the current to a reference signal and sends a fault signal to a hold circuit and an error counter when the current exceeds the reference signal. In order to protect the transistor pass element during the duty cycle, a cyclical shutdown circuit switches off the transistor pass element as long as the hold circuit holds the fault signal. The hold circuit is reset in the next cycle of the oscillator to allow the transistor pass element to be switched on.

In order to protect against numerous faults, the error counter is incremented by each fault signal. When the error counter indicates a selected value, the overcount shutdown circuit switches off the transistor pass element for a set number of cycles, thereby preventing the overheating of the transistor pass element. This is accomplished by maintaining a constant pulse width modulation frequency and limiting the staring duty cycle.

BRIEF DESCRIPTION OF THE DRAWINGS

The above, as well as other advantages of the present invention will become readily apparent to those skilled in the art from the following detailed description of a preferred embodiment when considered in light of the accompanying drawings in which.

DETAILED DESCRIPTION OF THE PREFERRED EMBODIMENT

Figure 1:
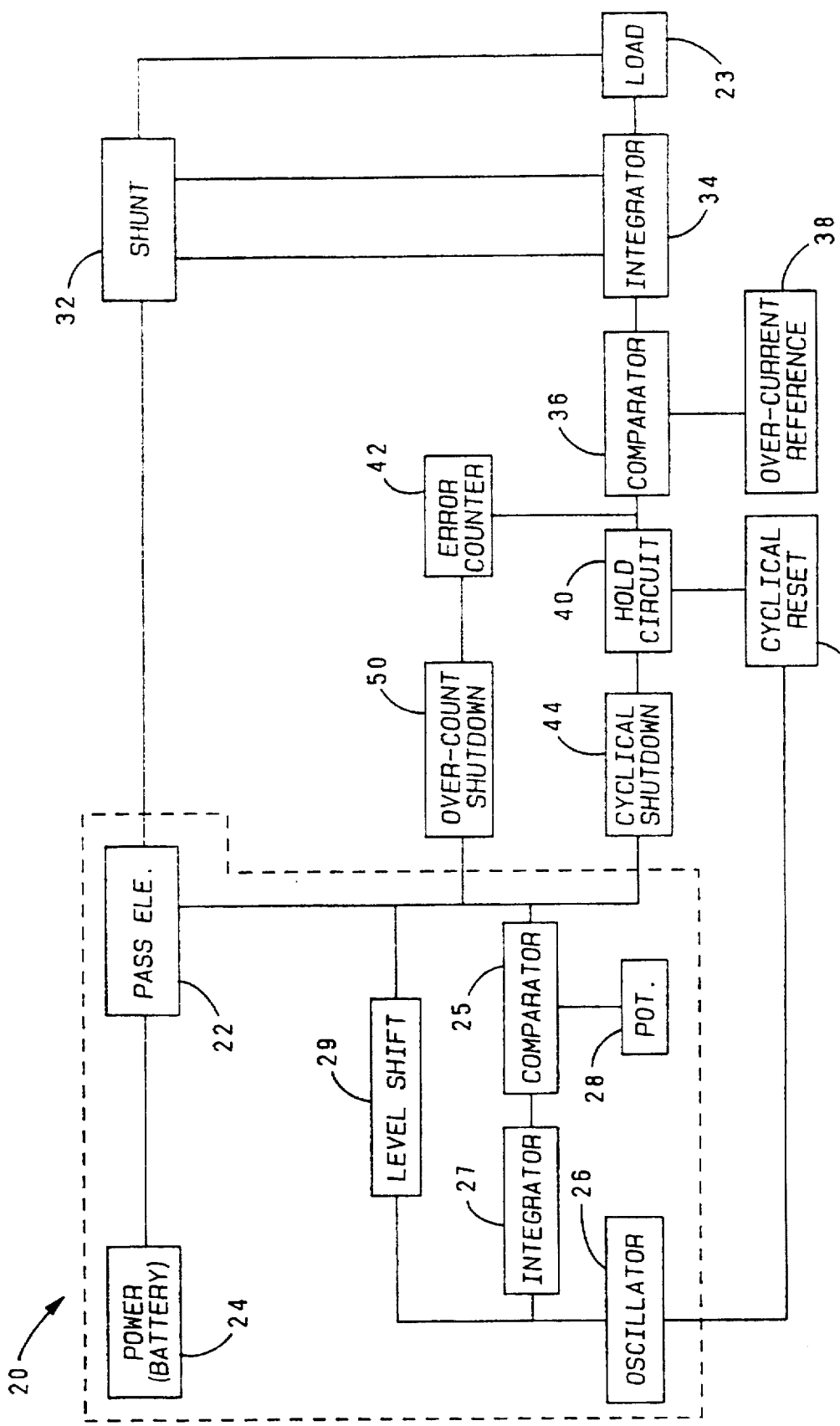
FIG. 1 is a block diagram of a pulse width modulation circuit of the present invention.

Referring to FIG. 1, a pulse width modulation circuit 20 according to the present invention for providing variable average power to a load is particularly useful for dimming instrument panel lamps in a vehicle. Overcurrent protection senses an overcurrent condition during a cycle and switches off a transistor pass element 22 for the remainder of the cycle. If the number of overcurrent conditions detected exceed a particular number, the transistor pass element 22 is turned off for a predetermined plurality of cycles. Due to these controls, the transistor pass element 22 is protected from overcurrent conditions during startup while supplying sufficient current to eventually heat the load 23 to steady state operation.

The pulse width modulation circuit 20 generally includes a pass element 22 connecting the power source 24 to the load 23. The pass element 22 is switched on and off by a comparator 25 at a constant frequency, thereby providing a pulsed output to the load 23. A square wave oscillator 26 is connected by an integrator 27 to one input of the comparator 25, and a variable reference voltage 28 is connected to the other input of the comparator 25. The integrator 27 converts the square wave signal from the oscillator 26 to a triangle wave signal. The comparator 25, having an oscillating triangle wave at one input, alternately switches on and off the pass element 22, thereby sending a pulsed output to the load 23. The duty cycle of the pulsed output is varied by increasing or decreasing the variable reference voltage 28 to the comparator 25. A level shift circuit 29 is connected in parallel with the integrator 27 and comparator 25.

A shunt 32 between the pass element 22 and load 23 senses current through the pass element 22 and sends a voltage signal to an integrator 34. The integrator 34 removes noise from the signal and sends a signal which is proportional to the current to a comparator 36. The comparator 36 compares this signal to a reference signal generated by an overcurrent reference 38. If the integrated current signal exceeds the overcurrent reference 38, the comparator 36 sends a fault signal to a hold circuit 40 and an error counter 42. The hold circuit 40 receives the fault signal from the comparator 36 and holds it until the end of the cycle. A cyclical shutdown circuit 44 switches off the pass element 22 as long as the hold circuit 40 holds the fault signal. Thus, the high current does not damage the pass element 22. A cyclical reset circuit 46 resets the hold circuit 40 on the next cycle of the oscillator 26.

The transistor pass element 22 dissipates heat for the rest of the cycle, thereby preventing damage. However, the temperature and resistance of the load 23 is increased by the current which was passed during the abbreviated duty cycle. The current through the pass element 22 and shunt 32 will decrease in each subsequent cycle until a safe, steady state current is reached which is below the reference current.

The error counter 42 increments upon every fault signaled by the comparator 36. After a predetermined number of faults, the error counter 42 signals the overcount shut down 50 to switch off the pass element 22 for a predetermined plurality of cycles sufficient to allow the transistor pass element 22 to dissipate heat thoroughly. It may be possible in some applications to select a sufficient number of cycles to protect the transistor pass element 22 without allowing the load 23 to cool and reduce resistance.

Figure 2:
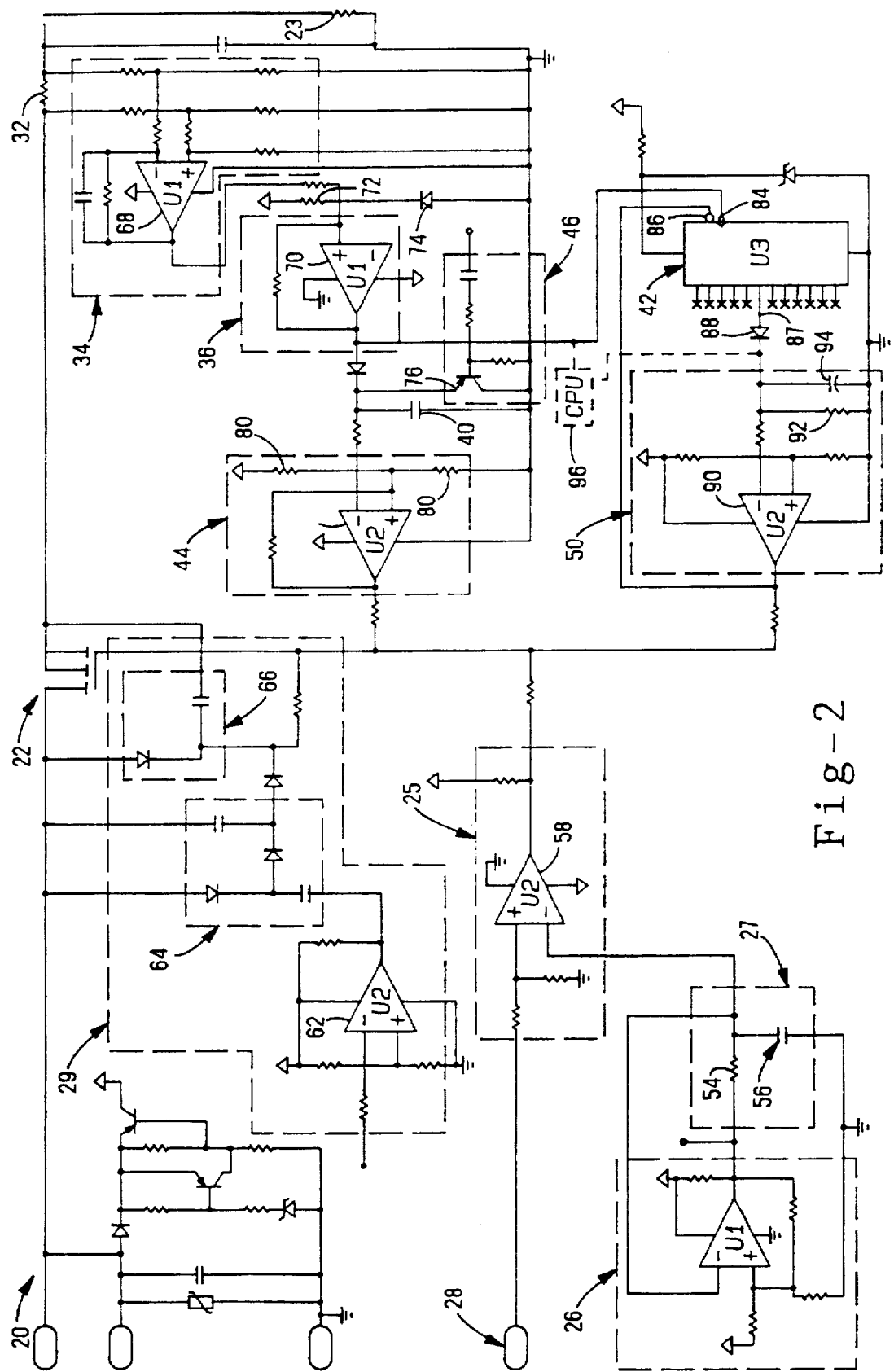
FIG. 2 is a detailed schematic of one circuit for implementing the pulse width modulation circuit of FIG. 1.

FIG. 2 is one possible schematic for implementing the pulse width modulation circuit 20 of FIG. 1 according to the present invention. The square wave oscillator 26 generally comprises an op amp circuit. The square wave output of the oscillator 26 is integrated by a resistor 54 and capacitor 56 into generally a triangle wave output, which is sent to the inverting input of an op amp 58 in the comparator 25. The operator adjusts the duty cycle of the pulse width modulation circuit 20 by adjusting the variable reference voltage 28, which is preferably a potentiometer 28, connected to the noninverting input of the op amp 58. In an instrument panel application, the potentiometer 28 is the dimmer switch.

The output of the comparator 25 is connected to the gate of the pass element 22. The pass element 22 is preferably a transistor such as a BJT or FET and is shown as an n-channel MOSFET transistor. The square wave output of the oscillator 26 is also connected to the inverting input of an op amp 62 in the level shift 29. A reference voltage is created at the non-inverting input of the op amp 62. The op amp 62 is connected to the gate of the pass element 22 by a charge pump 64. A boot strap circuit 66 including a diode and capacitor is preferably connected in parallel with the pass element 22. The level shift 29 acts as a voltage doubler necessary to drive the n-channel MOSFET in the high side configuration.

The shunt 32 connected between the pass element 22 and the load 23 can be a small resistor 32, although more complex current-indicating devices, such as current-sense FETs or current mirrors may also be used. In the embodiment shown, current through the pass element 22 creates a slight voltage drop over the shunt 32 which is sent to an op amp 68 in the integrator configuration 34. The integrator 34 removes noise or spikes in the current signal and generates a signal which is proportional to the current passing through the pass element 22.

The integrated current signal is connected to the non-inverting input of an op amp 70 in the comparator 36. A reference voltage is established at the inverting input of the op amp 70 by a resistor 72 and a zener diode 74. The output of the comparator 36 is held by the hold circuit 40, which is preferably a capacitor 40. The cyclical reset 46 preferably comprises a pnp transistor 76 connected in parallel with the capacitor 40, with the base of the pnp transistor 76 connected to the oscillator 26. The pnp transistor 76 discharges the capacitor 40 upon the subsequent negative signal from the oscillator 26, which would roughly correspond to the leading edge of the next duty cycle of the transistor pass element 22.

A reference voltage is established at the non-inverting input of the op amp 78 with a voltage divider circuit comprising a pair of resistors 80. The output of the op amp 78 of the cyclical shutdown circuit 44 drives the gate of the transistor pass element 22.

The hold circuit capacitor 40 holds the output from the comparator 36 at the inverting input to the op amp 78 in the cyclical shutdown circuit 44, thereby causing the op amp 78 to turn off the transistor pass element 22. This prevents damage to the transistor pass element 22. The hold circuit 40 holds the output from the comparator 36 at the inverting input of an op amp 78 in the cyclical shutdown circuit 44, even after the transistor pass element 22 is switched off and the comparator 36 discontinues the fault signal. The next negative signal from the oscillator 26 turns on transistor 76 of the cyclical reset circuit 46, thereby discharging the hold circuit capacitor 40 and turning off the cyclical shutdown circuit 44.

The output from the comparator 36 is also connected to the clock input 84 of an error counter 42 having a reset input 86. The error counter 42 is incremented by the negative signal after each fault signal sent by the comparator 36 to the clock input 84. It should be apparent that a counter that increments upon a positive clock input could also be used, and would only slightly change the timing of the shutdown of the transistor pass element 22.

Depending upon the particular application, one of the output bits of the counter 42 is connected to the cyclical shutdown circuit 44. In the example shown in FIG. 2, the Q6 output 87 is connected by a diode 88 to the inverting input of an op amp 90 in the cyclical reset circuit 44. A reference voltage is established at the non-inverting input of the op amp 90. A resistor 92 and capacitor 94 connected in parallel between the inverting input of op amp 90 and ground hold the output from the error counter 42 for a predetermined period of time established by the values of the resistor 92 and capacitor 94. The output of the op amp 90 is connected to the gate of the transistor pass element 22 and is fed back to the reset input 86 of the error counter 42. Each error signal from the comparator 36 increments the error counter 42 until the selected output bit 87, Q6 in this example, is high. The selected output bit 87 charges the capacitor 94 and causes the op amp 90 to turn off the transistor pass element 22 for a predetermined period of time, preferably a number of cycles. The op amp 90 resets the error counter 42, also resetting Q6 87, but the capacitor 94 holds the signal from the selected output bit 87 until discharged through the resistor 92. The resistor 92 and capacitor 94 are chosen so that the transistor pass element 22 is switched off for a period of time sufficient to prevent damage to the transistor pass element 22 and in some applications may be short enough so that the load 23 continues to heat and move toward a steady state. For example, a pulse width modulation circuit 20 operating at 100 hertz may be switched off for roughly 30 seconds before another attempt to start up the load is made.

The pulse width modulation circuit 20 of the present invention can be connected to a vehicle on board computer 96 to provide information regarding overcurrent conditions. For example, the output of the comparator 36 can be connected to the computer 96 to signal when the short circuit protection is engaged. Further the outputs of the error counter 42 can be connected to the computer 96 to indicate the number of faults which have occurred.

The pulse width modulation circuit 20 of the present invention protects the transistor pass element 22 from an overcurrent situation caused by a cold positive temperature coefficient load 23 or a short circuit of any cause and allows the transistor pass element 22 to be chosen for optimal steady state operation. The pulse width modulation circuit 20 protection automatically engages and restarts without the intervention of the user. Although the present invention has been described in terms of protection of the transistor pass element 22 for a positive temperature coefficient load 23, it should be apparent that the circuit protection is still available after the load reaches its steady state. It should be noted that the pulse width modulation circuit 20 of the present invention does not alter the operating frequency of the pulsed output to the load 23 and therefore does not cause any electrical noise interference problems.

In accordance with the provisions of the patent statutes, the present invention has been described in what is considered to represent its preferred embodiment. However, it should be noted that the invention can be practices otherwise than as specifically illustrated and described without departing from its spirit.

What is claimed is:

1. A pulse width modulation circuit for driving a load comprising:

a pass element alternately connecting and disconnecting a power source to said load;

a comparator comparing current through said pass element during a duty portion of a present duty cycle with a predetermined value, said comparator generating a fault signal when said current through said pass element exceeds said predetermined value;

a cyclical shutdown circuit connected to said comparator, said cyclical shutdown circuit switching off said pass element based upon said fault signal to abbreviate said duty portion of said present duty cycle and switching said pass element on after said present duty cycle;

an oscillator having a cyclical output, said pass element alternately switched on and off by said oscillator, wherein said cyclical shutdown circuit includes a capacitor coupled with a transistor, said capacitor charged by said fault signal and holding said fault signal, said cyclical shutdown circuit maintaining said pass element off as long as said capacitor holds said fault signal, said transistor switched on by said cyclical output of said oscillator thereby discharging said capacitor.

2. The pulse width modulation circuit of claim 1 wherein said pass element supplies a cyclical output to said load, said cyclical shutdown circuit switching off said pass element until a subsequent duty cycle of said pass element, said subsequent cycle immediately following said present duty cycle.

3. The pulse width modulation circuit of claim 1 further including:

said pass element switched off by said cyclical shutdown circuit during a first oscillator cycle; and a cyclical reset circuit resetting said cyclical shutdown circuit based upon said oscillator output.

4. The pulse width modulation circuit of claim 1 wherein said pass element is a transistor.

5. The pulse width modulation circuit of claim 1 wherein said load is a vehicle lamp.

6. The pulse width modulation circuit of claim 1 wherein power supplied by said pass element to said load is variable by an operator.

7. A pulse width modulation circuit for driving a load comprising:

a pass element alternately connecting and disconnecting a power source to said load;

a comparator comparing current through said pass element during a duty portion of a present duty cycle with a predetermined value, said comparator generating a fault signal when said current through said pass element exceeds said predetermined value;

a cyclical shutdown circuit connected to said comparator, said cyclical shutdown circuit switching off said pass element based upon said fault signal to abbreviate said duty portion of said present duty cycle and switching said pass element on after said present duty cycle;

an oscillator having a cyclical output, said pass element alternately switched on and off by said oscillator;

a cyclical reset circuit resetting said cyclical shutdown circuit based upon said oscillator output;

an error counter connected to said comparator, said error counter incremented by said fault signal from said comparator;

an over-count shutdown circuit connected to said error counter, said over-count shutdown circuit switching off said pass element for a predetermined period of time when said counter exceeds a predetermined number, said pass element switching on after said predetermined period of time.

8. The pulse width modulation circuit of claim 7 further including:

said pass element being switched on after said predetermined period of time by a cycle of said oscillator subsequent to said predetermined period of time.

9. The pulse width modulation circuit of claim 7, wherein said error counter includes a plurality of output bits including a selected output bit connected to said over-count shutdown circuit, a capacitor holding the signal from said selected output bit for a plurality of cycles.

10. The pulse width modulation circuit of claim 7 further including:

said fault signal being generated during a first cycle of said oscillator;

a hold circuit receiving said fault signal, said hold circuit connected to said cyclical shutdown circuit, said cyclical shutdown circuit switching said pass element off as long as said hold circuit holds said fault signal;

said cyclical reset circuit resetting said hold circuit, said cyclical reset circuit being triggered by a subsequent cycle of said oscillator subsequent to said first cycle.

11. A pulse width modulation circuit for driving a load comprising:

a pass element alternately connecting and disconnecting a power source to said load;

a comparator comparing current through said pass element during a duty portion of a present duty cycle with a predetermined value, said comparator generating a fault signal when said current through said pass element exceeds said predetermined value;

a cyclical shutdown circuit connected to said comparator, said cyclical shutdown circuit switching off said pass element based upon said fault signal to abbreviate said duty portion of said present duty cycle and switching said pass element on after said present duty cycle;

an oscillator having a cyclical output, said pass element alternately switched on and off by said oscillator;

a cyclical reset circuit resetting said cyclical shutdown circuit based upon said oscillator output;

wherein said load has a positive temperature coefficient and resistance, said current through said pass element heating said load and raising said resistance of said load, said cyclical shutdown circuit incrementally increasing said duty portion of said pass element in successive duty cycles until said resistance of said load is sufficiently high that said current does not exceed said predetermined value.

12. The pulse width modulation circuit of claim 11, wherein said current through said pass element being compared with said predetermined value by way of said comparator is first inputted to an integrator which generates an integrated signal based upon the current through said pass element, said integrated signal being output to said comparator for comparison with said predetermined value.

13. A method for protecting a pulse width modulator circuit from a current overload, said pulse width modulator circuit including a pass element alternately connecting and disconnecting a power supply to a load, said method including the steps of:
   1) generating a cyclical input to said pass element to alternately connect and disconnect said power supply to said load, said pass element thereby generating a cyclical output having a duty portion and an off portion;
   2) sensing current through said pass element during a duty portion;
   3) comparing said current with a predetermined value;
   4) generating a fault signal based upon said comparison of said current with said predetermined value;
   5) abbreviating a plurality of consecutive duty portions of said pass element based upon a plurality of fault signals generated in said plurality of consecutive duty portions;
   6) counting the number of fault signals;
   7) comparing said number of fault signals with a predetermined number of faults;
   8) switching off said pass element for a predetermined period of time after said plurality of abbreviated duty cycles based upon said comparison of said number of fault signals and said predetermined number; and
   9) switching on said pass element after said predetermined period of time.

14. The method according to claim 13, further including the steps of:
   incrementing a counter when said current exceeds said predetermined value;
   switching off said pass element for said predetermined time period when said counter indicates a predetermined number; and
   switching on said pass element after said predetermined time period.

15. The method according to claim 14, further including the step of resetting said counter during said predetermined time period.

16. The method according to claim 13, wherein step 3 includes the steps of:
   converting said current to a voltage signal;
   generating a reference voltage signal; and
   comparing said voltage signal and said reference voltage signal.

17. The method according to claim 13, further including the step of utilizing said pulse width modulation circuit in a vehicle dimmer circuit.

18. The method according to claim 13 further including the step of:
   switching on said pass element in each of said plurality of consecutive duty portions based upon a cycle of said cyclical input subsequent to each said abbreviated duty portion.

19. A method for protecting a pulse width modulator circuit from a current overload including the steps of:
   1) generating a cyclical input to a pass element to alternately connect and disconnect a power supply to a load, said pass element thereby generating a cyclical output having a duty portion and an off portion;
   2) sensing current through said pass element during a first duty portion of said pass element;
   3) comparing said current through said pass element to a predetermined value;
   4) abbreviating said first duty portion of said pass element by setting a cyclical shutdown circuit when said current through said pass element exceeds said predetermined value;
   5) resetting said cyclical shutdown circuit based upon a cycle of said cyclical input subsequent to said first duty portion:
   6) heating said load with said current;
   7) raising a resistance of said load by said heating;
   8) incrementally increasing said duty portion of said pass element until said resistance of said load is sufficiently high that said current does not exceed said predetermined value.

20. The method according to claim 19 wherein step 3) includes the steps of:
   integrating the current through said pass element over time and comparing said integration of said current to said predetermined value.

* * * * *